(12) United States Patent
Kamino et al.

(10) Patent No.: US 12,665,158 B2
(45) Date of Patent: Jun. 23, 2026

(54) CHARGED PARTICLE BEAM SOURCE AND CHARGED PARTICLE BEAM SYSTEM

(71) Applicant: JEOL Ltd., Tokyo (JP)

(72) Inventors: Kyouichi Kamino, Tokyo (JP);
Tomohisa Fukuda, Tokyo (JP);
Norikazu Arima, Tokyo (JP); Yasuyuki Okano, Tokyo (JP); Keiichi Yamamoto, Tokyo (JP)

(73) Assignee: JEOL Ltd., Tokyo (JP)

( * ) Notice: Subject to any disclaimer, the term of this patent is extended or adjusted under 35 U.S.C. 154(b) by 412 days.

(21) Appl. No.: 18/121,931

(22) Filed: Mar. 15, 2023

(65) Prior Publication Data

US 2023/0317400 A1 Oct. 5, 2023

(30) Foreign Application Priority Data

Mar. 29, 2022 (JP) ................................. 2022-053960

(51) Int. Cl.
$H01J\ 37/067$ (2006.01)
$H01J\ 37/18$ (2006.01)
$H01J\ 37/28$ (2006.01)

(52) U.S. Cl.
CPC ............ H01J 37/067 (2013.01); H01J 37/18 (2013.01); H01J 37/28 (2013.01)

(58) Field of Classification Search
None
See application file for complete search history.

(56) References Cited

U.S. PATENT DOCUMENTS

| | | | | |
|---|---|---|---|---|
| 3,478,244 A | * | 11/1969 | Scheffels | H01J 37/067 |
| | | | | 313/236 |
| 4,528,474 A | * | 7/1985 | Kim | H01J 9/04 |
| | | | | 313/308 |
| 9,165,742 B1 | * | 10/2015 | Simmons | H01J 37/06 |
| 2009/0294697 A1 | * | 12/2009 | Katagiri | H01J 37/18 |
| | | | | 250/496.1 |

(Continued)

FOREIGN PATENT DOCUMENTS

| | | |
|---|---|---|
| JP | S447248 Y | 3/1944 |
| JP | S6089049 A | 5/1985 |

(Continued)

OTHER PUBLICATIONS

Extended European Search Report issued in EP23162266.3 on Aug. 4, 2023.
Office Action issued in JP2022053960 on Mar. 19, 2024.

*Primary Examiner* — James Choi
(74) *Attorney, Agent, or Firm* — The Webb Law Firm

(57) ABSTRACT
Provided is a charged particle beam source having an emitter that can be replaced easily. The charged particle beam source includes an electron gun chamber; a first unit including both a supportive insulative member mechanically supporting a cable and a first set of terminals electrically connected to the cable; and a second unit including both the emitter that releases charged particles and a second set of terminals electrically connected to the emitter. The chamber has a side wall provided with a through-hole in which the first unit is secured. The second unit can be detachably mounted to the first unit. Within the chamber, the emitter is placed on an optical axis, so that the first and second sets of terminals are brought into contact with each other.

14 Claims, 9 Drawing Sheets

(56)          References Cited

U.S. PATENT DOCUMENTS

2020/0161086 A1     5/2020  Chun
2020/0266024 A1 *   8/2020  Matsumura ........... H01J 37/141

FOREIGN PATENT DOCUMENTS

JP           2009245725  A      10/2009
JP           2016110695  A       6/2016
JP             6094786  B2  *    3/2017   ................ H01J 5/14

* cited by examiner

CHARGED PARTICLE BEAM SOURCE AND CHARGED PARTICLE BEAM SYSTEM

CROSS-REFERENCE TO RELATED APPLICATION

This application claims priority to Japanese Patent Application No. 2022-053960, filed on Mar. 29, 2022, the disclosure of which is hereby incorporated by reference in its entirety.

BACKGROUND OF THE INVENTION

1. Field of the Invention

The present invention relates to a source of a charged particle beam and to a charged particle beam system.

2. Description of Related Art

In a charged particle beam system such as an electron microscope or a focused ion beam system, an electron gun or an ion gun is used as a source of a charged particle beam. Emitters used in electron guns and ion guns have limited life and so they need to be exchanged periodically.

For example, JP-A-2009-245725 discloses an electron beam generator having a filament (emitter) which can be easily replaced while maintaining the interior of the electron gun chamber at a high vacuum.

As described above, sources of charged particle beams such as electron guns and ion guns are required to have easily replaceable emitters.

SUMMARY OF THE INVENTION

One aspect of a charged particle beam source associated with the present invention comprises: a chamber having a side wall; a first unit including both a supportive insulative member mechanically supporting a cable and a first set of terminals electrically connected to the cable; and a second unit including both an emitter for emitting charged particles and a second set of terminals electrically connected to the emitter. The first unit is secured in a through-hole formed in the side wall. The second unit can be attached and detached to and from the first unit. In the chamber, the emitter is placed on an optical axis, whereby the first and second sets of terminals are brought into contact with each other.

In this charged particle beam source, the second unit can be detachably attached to the first unit and so the emitter can be easily replaced. Furthermore, in this beam source, the emitter is placed on the optical axis, whereby the first and second sets of terminals are brought into contact with each other. This allows for easy replacement of the emitter.

One aspect of a charged particle beam system associated with the present invention includes the above-described charged particle beam source.

DESCRIPTION OF THE INVENTION

The preferred embodiments of the present invention are hereinafter described in detail with reference to the accompanying drawings. It is to be noted that the embodiments described below are not intended to unduly restrict the scope and spirit of the present invention delineated by the appended claims and that not all the configurations described below are the essential constituent components of the present invention.

1. First Embodiment

1.1. Electron Microscope

Figure 1:
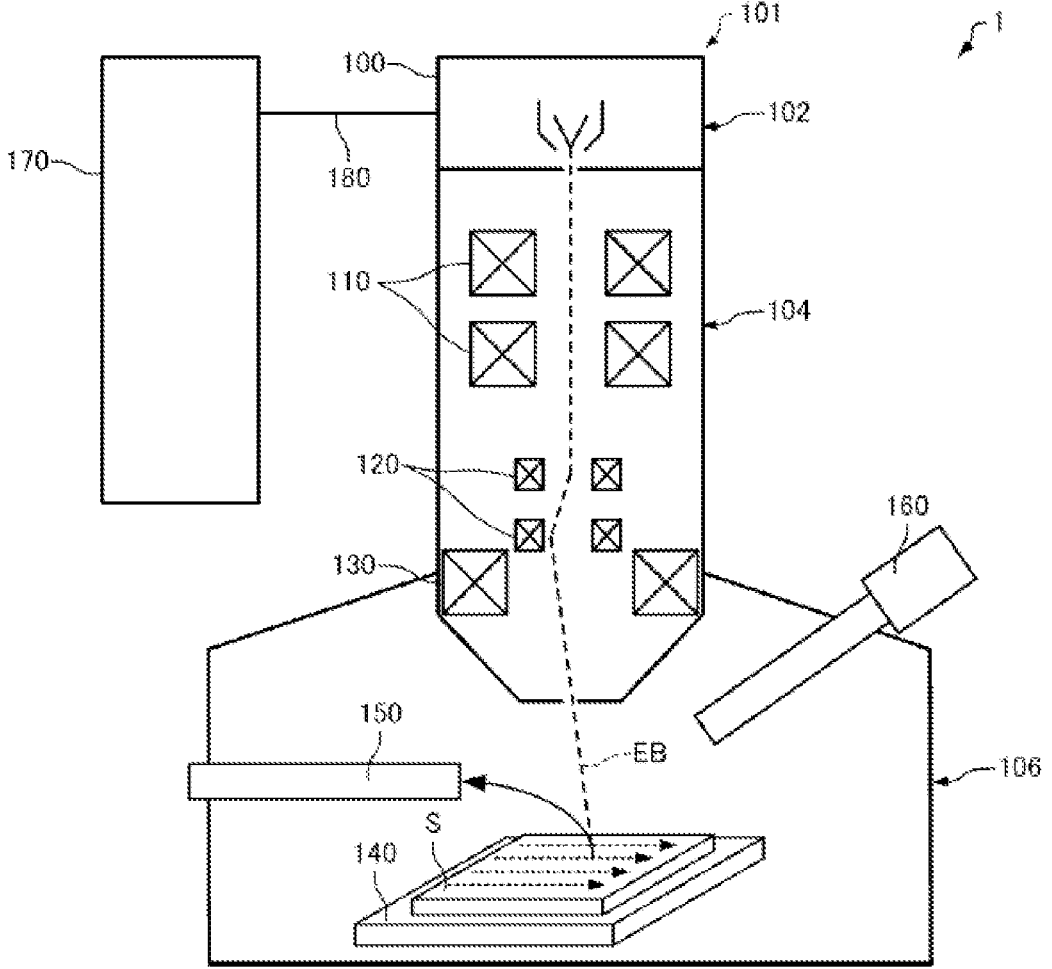
FIG. 1 is a schematic diagram showing the configuration of an electron microscope associated with a first embodiment of the present invention.

An electron microscope associated with a first embodiment of the present invention is first described by referring to FIG. 1, which shows the configuration of this electron microscope, 1. The microscope 1 is an apparatus for capturing a scanned image of a sample S by scanning it with an electron probe. In the electron microscope 1, scanned images include secondary electron images and elemental maps.

Referring still to FIG. 1, the electron microscope 1 includes an electron gun 100 (one example of a charged particle beam source), condenser lenses 110, scan coils 120, an objective lens 130, a sample stage 140, a secondary electron detector 150, an X-ray detector 160, a high-voltage power supply 170, and a high-voltage cable 180. The electron gun 100 which emits an electron beam EB will be described in detail later.

The electron beam EB emitted from the electron gun 100 is focused into an electron probe by the action of the condenser lenses 110 and the objective lens 130. The scan coils 120 deflect the electron beam EB in two dimensions. This makes it possible to scan the sample S with the electron probe.

The electron microscope 1 has an electron optical column 101 which forms and scans the electron probe. The electron optical column 101 is made up of the electron gun 100, condenser lenses 110, scan coils 120, and objective lens 130. An electron gun compartment 102 and an intermediate chamber 104 are formed in the electron optical column 101. An electron emitter that is a source of electrons is housed in the electron gun compartment 102. An electron optical system including the condenser lenses 110, scan coils 120, and objective lens 130 is housed in the intermediate chamber 104.

The sample stage 140 is disposed in a sample chamber 106, and the sample S is placed on the sample stage 140 which in turn can hold the sample S. The sample stage 140 has a drive mechanism for moving the sample S.

The secondary electron detector 150 detects secondary electrons released from the sample S in response to irradiation of the sample S with the electron beam EB. A secondary electron image can be obtained by scanning the sample S with the electron probe and detecting the secondary electrons emanating from the sample S by the secondary electron detector 150. The electron microscope 1 may also be equipped with a backscattered electron detector for detecting backscattered electrons released from the sample S in response to irradiation of the sample S with the electron beam EB.

The X-ray detector 160 detects characteristic X-rays produced in response to irradiation of the sample S with the electron beam EB. The X-ray detector 160 is an energy dispersive X-ray spectrometer, for example. Alternatively, the X-ray detector 160 may be a wavelength dispersive X-ray spectrometer. An elemental map can be generated by scanning the sample S with the electron probe and detecting characteristic X-rays emanating from the sample S by means of the X-ray detector 160.

The high-voltage power supply 170 is electrically connected with the emitter of the electron gun 100 and with various electrodes via the high-voltage cable 180 and operates to supply a negative high voltage to the electron gun 100.

1.2. Configuration of Electron Gun

Figure 2:
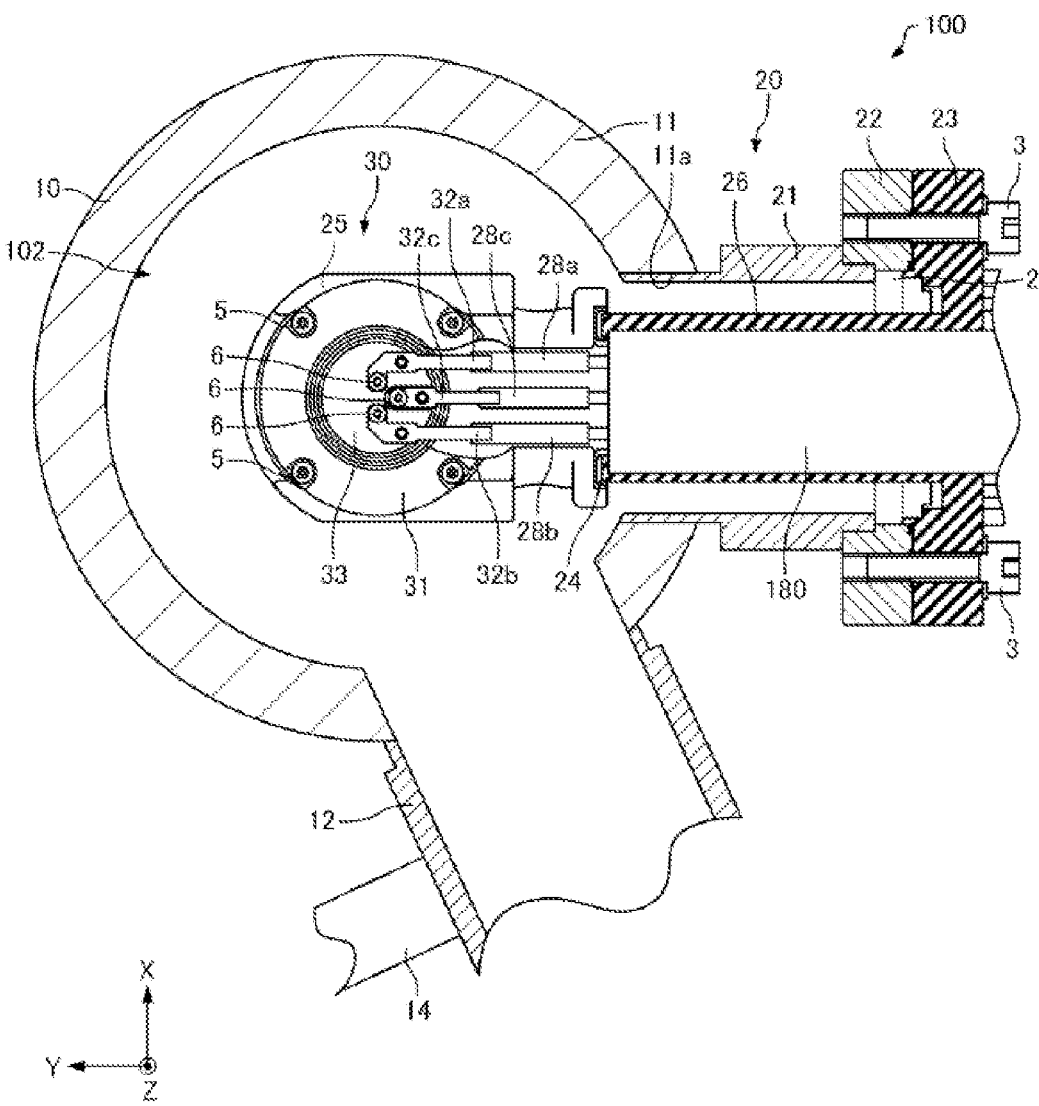
FIG. 2 is a schematic cross section of an electron gun of the electron microscope of FIG. 1.
Figure 3:
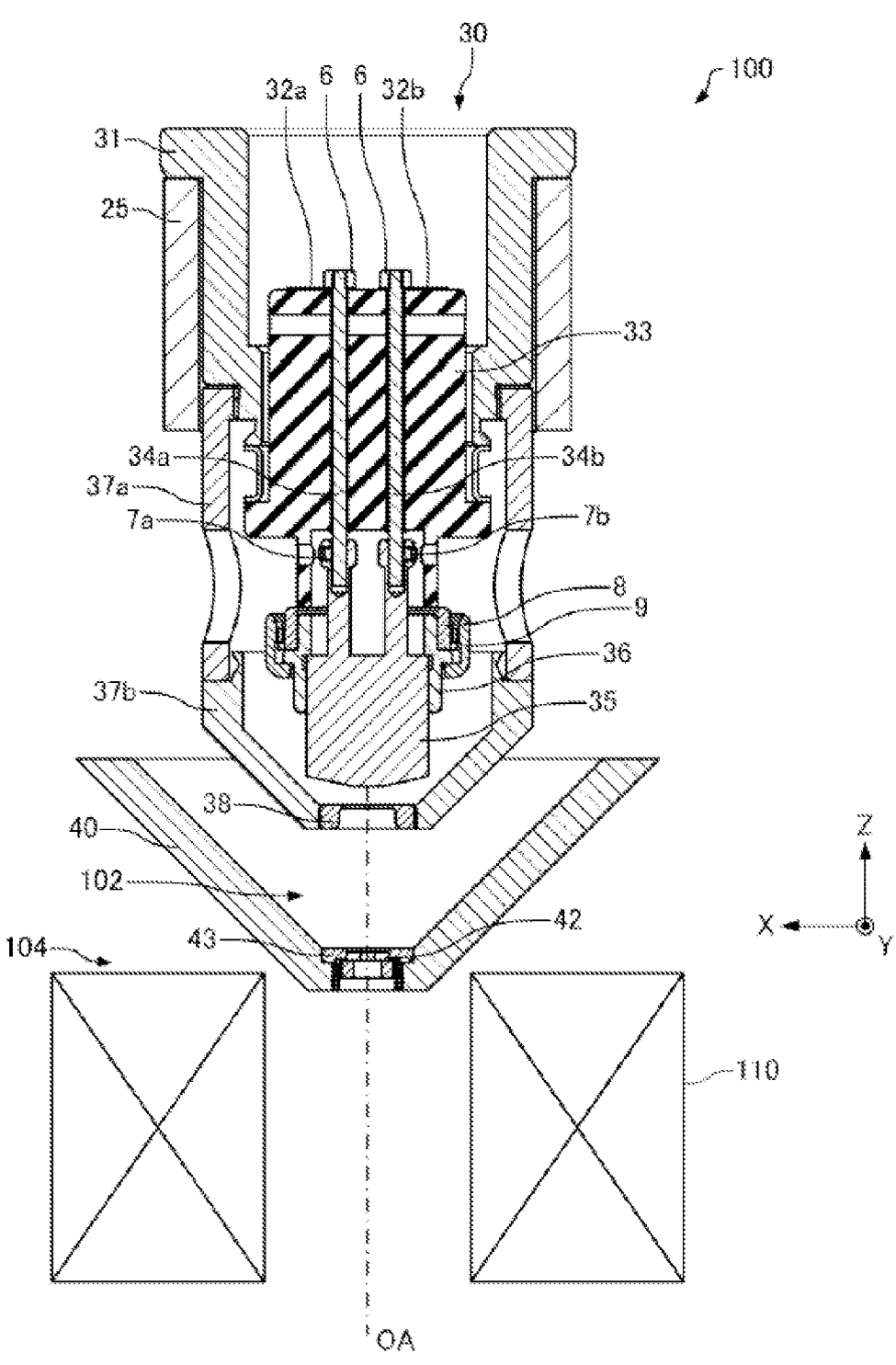
FIG. 3 is a schematic vertical cross-sectional view of the electron gun of FIG. 2.
Figure 4:
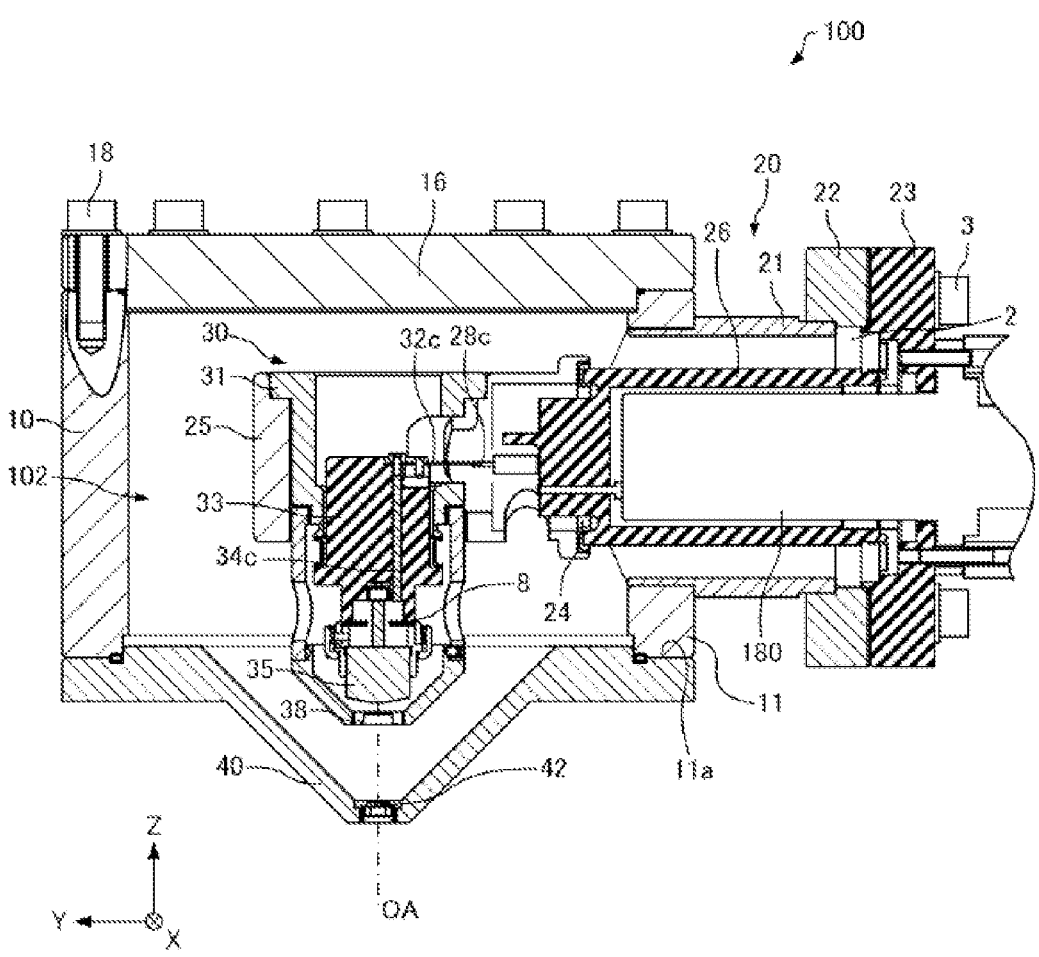
FIG. 4 is a schematic horizontal cross-sectional view of the electron gun of FIG. 2.

FIGS. 2-4 are schematic cross-sectional views of the electron gun 100 of the electron microscope 1 associated with the first embodiment. In FIGS. 2-4, there are shown X-, Y-, and Z-axes which are perpendicular to each other. As shown in these figures, the electron gun 100 includes the electron gun chamber 10, a chamber cover 16 (FIG. 4), a supportive insulator unit 20 (one example of a first unit), an emitter unit 30 (one example of a second unit), and an anode 40. The electron gun 100 is a Schottky emission gun utilizing the Schottky effect in which if a strong electric field is applied to a substance, the potential barrier drops, resulting in emission of more thermoelectrons.

The electron gun compartment 102 in which the emitter unit 30 is housed is formed in the electron gun chamber 10 having a side wall 11. A first pipe 12 is joined to, and extend through, the side wall 11. An ultrahigh vacuum pump (not shown) (such as an ion pump) is connected to the first pipe 12 so that the inside of the electron gun chamber 10 can be maintained in an ultrahigh vacuum of below $10^{-5}$ Pa. A second pipe 14 is connected to the first pipe 12, and a roughing vacuum pump (not shown) (such as an oil rotary pump) is connected to the second pipe 14.

The electron gun chamber 10 has an opening on its top side, the opening being hermetically sealed by the chamber cover 16. The chamber cover 16 has a flange provided with through-holes through which bolts 18 are passed to secure the flange to the electron gun chamber 10.

The supportive insulator unit 20 includes a pipe 21, an inner flange 22, an outer flange 23, a plate 24, a support member 25, a supportive insulator 26, and electric terminals 28a, 28b, 28c. The insulator unit 20 is secured in a through-hole 11a formed in the side wall 11 of the electron gun chamber 10. The pipe 21 is inserted in the through-hole 11a. The pipe 21 and the side wall 11 are welded together. The inner flange 22 is joined to the front end of the pipe 21.

The supportive insulator 26 mechanically supports and electrically insulates the high-voltage cable 180 which is a high withstand voltage cable serving to connect together the high-voltage power supply 170 and the emitter unit 30. The cable 180 has a plurality of core wires. The supportive insulator 26 is electrically insulative in nature and inserted in the pipe 21 of the insulator unit 20. The outer flange 23 is welded, brazed, or otherwise bonded to the rear end of the supportive insulator 26. The outer flange 23 is fastened to the inner flange 22 with bolts 3 via a metal O-ring 2. As a result, hermetic sealing between the two flanges 22 and 23 can be accomplished.

The support member 25 providing mechanical support of the emitter unit 30 is mounted at the front end of the supportive insulator 26. The plate 24 is brazed to the front end of the supportive insulator 26. The support member 25 is secured to the insulator 26 via the plate 24. Note that the insulative member that electrically insulates and mechanically supports the high-voltage cable 180 is not restricted to the supportive insulator 26.

The support member 25 is a cylindrical member, for example, in which the emitter unit 30 is inserted and fitted. As a result, the emitter unit 30 is placed in position and an electron emitter 35 is placed on an optical axis OA which is parallel to the Z-axis in the illustrated example.

A plurality of electric terminals are secured to the front end of the supportive insulator 26. These terminals are 28a, 28b, and 28c in the illustrated example and these terminals 28a-28c are electrically connected with the high-voltage cable 180.

The terminal 28a of the insulator unit is an electrically conductive pipe, for example, and elongated in a direction orthogonal to the optical axis OA, i.e., elongated along the Y-axis. The terminals 28b and 28c of the insulator unit are electrically conductive pipes in the same way as the terminal 28a and are similar in shape to the terminal 28a.

Figure 5:
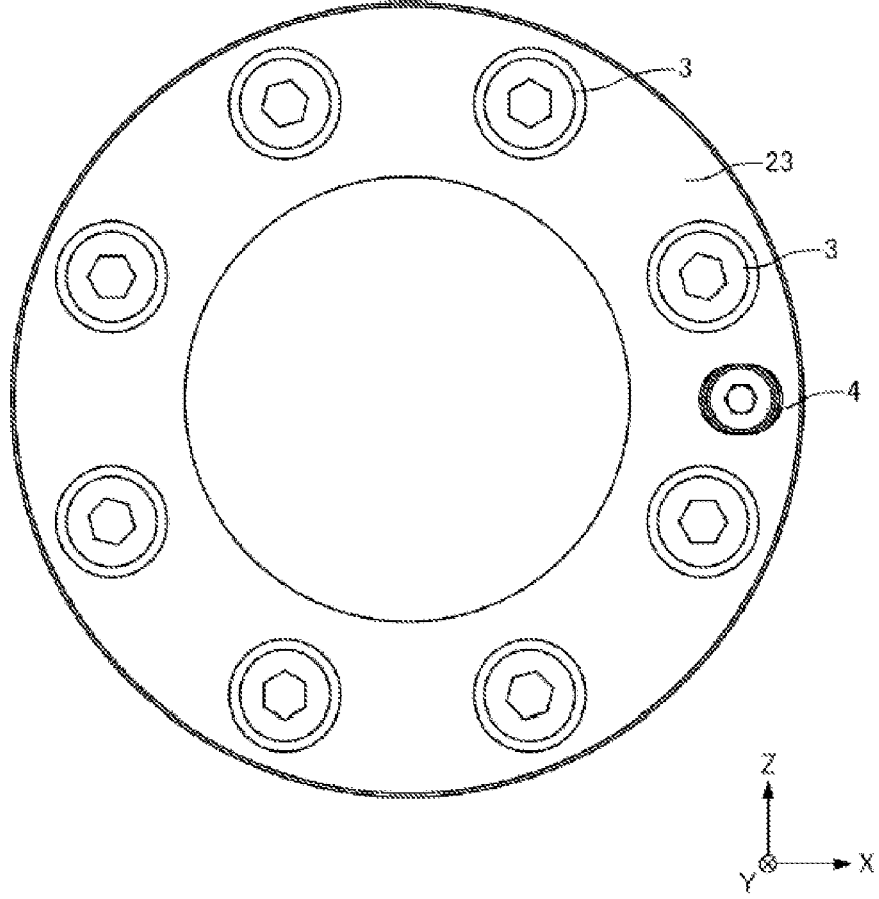
FIG. 5 is a schematic plan view of a flange.

FIG. 5 schematically shows the outer flange 23. Each of the flanges 22 and 23 is provided with a hole for passage of a positioning pin 4. Rotation of the insulator unit 20 can be prevented by inserting the positioning pin 4 into the holes of the flanges 22 and 23.

Referring back to FIGS. 2-4, the emitter unit 30 includes a flange 31, a second set of terminals 32a, 32b, 32c, an insulative member 33, feedthroughs 34a, 34b, 34c, the electron emitter 35, a holder 36, electrodes 37a, 37b, and an extraction electrode 38. The flange 31 is cylindrical and inserted inside the support member 25. The flange 31 is brought into fitting engagement with the support member 25, whereby the emitter 35 is placed in position. The flange 31 and the support member 25 are secured with bolts 5.

The terminals 32a, 32b, and 32c are fixed on the insulative member 33. The terminal 32a has electrical conductivity and is made of a resilient body. For example, the terminal 32a is a leaf spring. Each of the other two terminals 32b and 32c has electrical conductivity and is a leaf spring in the same way as the first-mentioned terminal 32a.

The terminal 32a is connected with the feedthrough 34a and has a front end in which a spiral groove is formed. The terminal 32a is secured to the insulative member 33 with nuts 6. Similarly, the terminal 32b is connected with the feedthrough 34b and fastened to the insulative member 33 with nuts 6, and the terminal 32c is connected with the feedthrough 34c and affixed to the insulative member 33 with nuts 6.

The feedthroughs 34a, 34b, and 34c are inserted in, and mechanically supported and electrically insulated by, the supportive insulative member 33. The feedthrough 34a is connected with one terminal of the emitter 35. The feedthrough 34b is connected with the other terminal of the emitter 35. Consequently, the emitter 35 and the high-voltage power supply 170 can be electrically interconnected.

A suppressor (not shown) is disposed between the emitter 35 and the extraction electrode 38 and applied with a negative potential relative to the emitter 35. The feedthrough 34c is electrically connected with the suppressor and also with the flange 8 via a metallization layer deposited on the insulative member 33. The flange 8 is in contact with the suppressor and thus the suppressor can be electrically connected with the high-voltage power supply 170. In the electron gun 100, the suppressor and the high-voltage cable 180 can be electrically interconnected via the metallization layer and so members which would otherwise cause electric discharge can be reduced in number. This can reduce the possibility that the emitter 35 will be damaged.

The emitter 35 is a source of electrons and consists of a tungsten chip whose surface is coated with zirconium oxide, for example. The emitter 35 is mechanically supported by the feedthroughs 34a and 34b. The emitter 35 and the feedthrough 34a are secured by a bolt 7a. The emitter 35 and the feedthrough 34b are secured by a bolt 7b.

The holder 36 is cylindrical in shape and surrounds the emitter 35. The emitter 35 is fitted inside the holder 36. Consequently, the emitter 35 can be placed in position. The flange 8 is brazed to the insulative member 33. The holder 36 and the flange 8 are secured with nuts 9.

The extraction electrode 38 is positioned under the emitter 35 and provided with a hole for passage of electrons released from the emitter 35. The extraction electrode 38 is mechanically supported by the electrodes 37a and 37b. The electrode 37a is in threaded engagement with the flange 31. The electrode 37b is secured to the electrode 37a with a screw. The extraction electrode 38 is coupled to the front end of the electrode 37b and can be mechanically adjusted in position by a position adjusting screw (not shown).

An extraction voltage is applied to the extraction electrode 38 to extract electrons from the emitter 35. The support member 25 is electrically connected with the high-voltage cable 180 and in contact with the flange 31. Therefore, the extraction voltage is applied to the extraction electrode 38 via the high-voltage cable 180, support member 25, flange 31, and electrodes 37a, 37b.

The anode 40 is located under the extraction electrode 38. An apertured plate 42 is mounted to the front end of the anode 40, is in threaded engagement with a holder 43, and provides an orifice or aperture between the interior of the electron gun chamber 10 and the intermediate chamber 104 that resides immediately below the gun chamber 10. The orifice passes an electron beam and maintains the pressure difference between the two chambers. The holder 43 is secured to the anode 40.

1.3. Operation of Electron Gun

In the electron gun 100, electrical current is supplied from the high-voltage power supply 170 to the emitter 35 via the high-voltage cable 180 to heat the emitter 35. Also, a negative high voltage is applied from the high-voltage power supply 170 to the emitter 35 via the high-voltage cable 180. Furthermore, a potential that is negative relative to the emitter 35 is applied to the suppressor from the high-voltage power supply 170 via the high-voltage cable 180. In addition, the extraction voltage is applied to the extraction electrode 38 from the high-voltage power supply 170 via the high-voltage cable 180.

In the electron gun 100, if electrical current is supplied to the emitter 35 and the emitter 35 becomes heated, a strong electric field produced across the surface of the emitter 35 by the extraction electrode 38 extracts electrons from the emitter 35. At this time, the unwanted thermoelectrons released from the emitter 35 are blocked by the suppressor and are not emitted from the electron gun 100. The electrons extracted from the emitter 35 are accelerated by the anode 40 at ground potential and focused by the condenser lenses 110.

1.4. Replacement of Emitter

Figure 6:
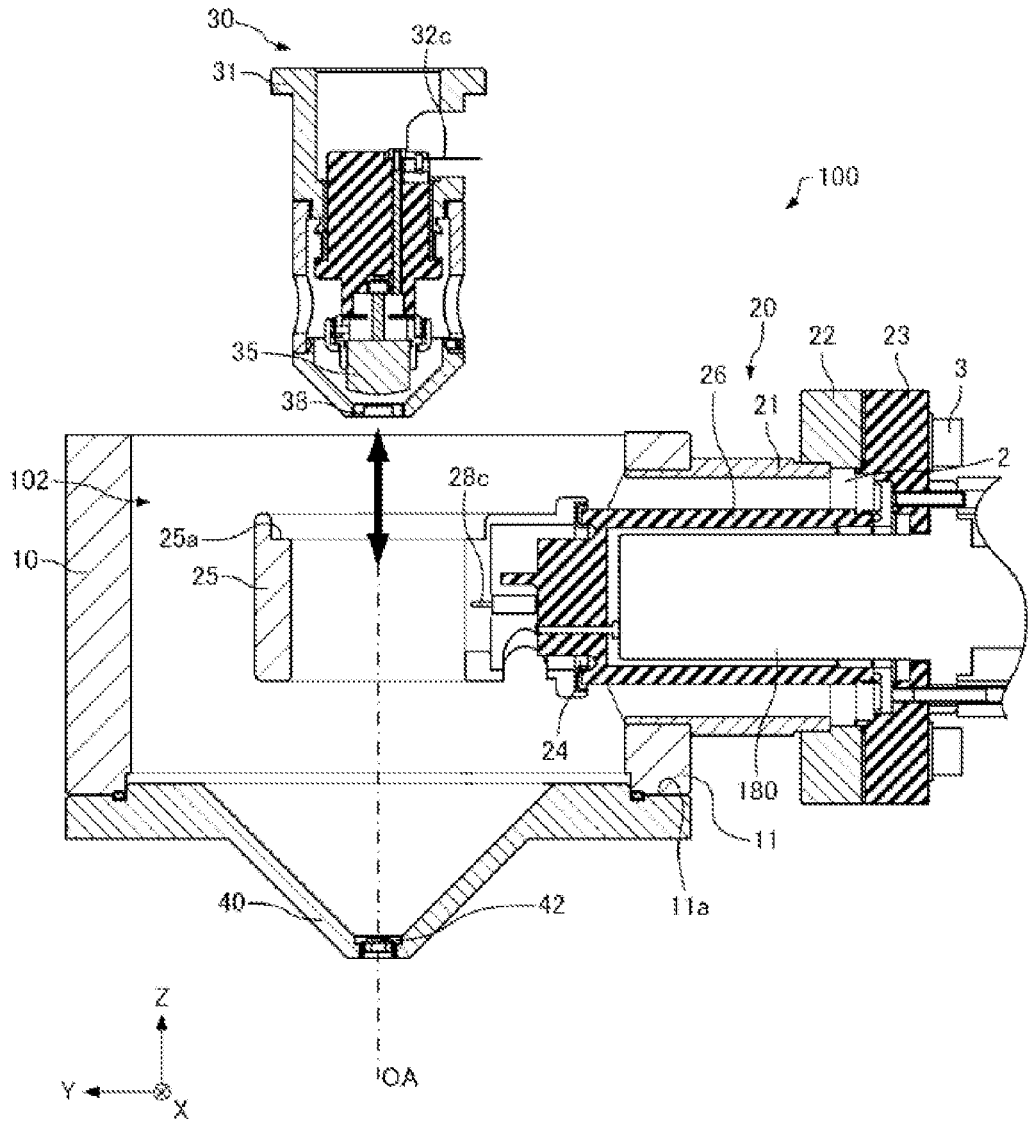
FIG. 6 is a schematic cross-sectional view illustrating a step of replacing an emitter.

FIG. 6 is a typical cross-sectional view illustrating a step of replacing the emitter 35. First, the interior of the electron gun chamber 10 is placed at atmospheric pressure. Then, the bolts 18 of FIG. 4 are taken away and the chamber cover 16 is removed from the gun chamber 10. The bolts 5 fastening together the emitter unit 30 and support member 25 as shown in FIG. 2 are removed.

Then, as shown in FIG. 6, the emitter unit 30 is raised and taken out through the top opening of the electron gun chamber 10. The bolt 7a fastening together the feedthrough 34a and the emitter 35 as shown in FIG. 3 and the bolt 7b fastening together the feedthrough 34b and the emitter 34 are loosened, and the emitter 35 are then taken out. A new emitter 35 is mounted.

In particular, the new emitter 35 is fastened to the feedthroughs 34a and 34b with the bolts 7a and 7b. At this time, the emitter 35 is fitted to the holder 36 and placed in position. In the emitter unit 30 on which the new emitter 35 has been mounted, the emitter 35 and the extraction electrode 38 are adjusted in position. The emitter unit 30 is put into a furnace and baked, thus degassing the emitter unit 30, i.e., gas occluded in the emitter unit 30 can be forcibly removed.

After the baking, the emitter unit 30 is inserted into the support member 25 of the insulator unit 20 along the Z-axis from the top opening of the electron gun chamber 10. As a result, the emitter unit 30 is fitted to the support member 25 and the emitter 35 is placed in position.

The support member 25 has a central axis coincident with the optical axis OA. In the electron gun 100, the surface of the inner flange 22 which comes into contact with the outer flange 23 is precisely placed in position such that when the surface of the inner flange 22 touches the outer flange 23, the central axis of the support member 25 becomes coincident with the optical axis OA. Therefore, securing the outer flange 23 to the inner flange 22 results in coincidence of the center axis of the support member 25 with the optical axis OA. Consequently, fitting the emitter unit 30 to the support member 25 places the emitter 35 on the optical axis OA.

The surface 25a of the support member 25 that comes into contact with the flange 31 determines the position of the emitter unit 30 as taken in the Z direction. Accordingly, fitting the emitter unit 30 to the support member 25 determines the position of the emitter 35 as taken in the Z direction. In this way, in the electron gun 100, fitting the emitter unit 30 to the support member 25 can place the emitter 35 in position.

Inserting the emitter unit 30 into the support member 25 brings the terminal 32a of the emitter unit 30 into contact with the terminal 28a of the insulator unit. The terminal 32c is a resilient leaf spring. The emitter unit terminal 32c comes into contact with the terminal 28c of the insulator unit 20 and undergoes flexure. This assures that the emitter unit terminal 32c is connected with the insulator unit terminal 28c.

Similarly, inserting the emitter unit 30 into the support member 25 brings the emitter unit terminal 32a into contact with the insulator unit terminal 28a. The terminal 32a is a resilient leaf spring. The terminal 32a comes into contact with the terminal 28a and undergoes flexure. Hence, the emitter unit terminal 32a can be connected with the insulator unit terminal 28a with certainty.

Similarly, inserting the emitter unit 30 into the support member 25 brings the terminal 32*b* into contact with the terminal 28*b*. The terminal 32*b* is a resilient leaf spring. The terminal 32*b* comes into contact with the terminal 28*b* and undergoes flexure. This ensures that the terminal 32*b* is connected with the terminal 28*b*. Because the terminals of the emitter unit 30 come into contact with the terminals of the insulator unit 20, the emitter unit 30 and the high-voltage power supply 170 are electrically interconnected. After inserting the emitter unit 30 into the support member 25, the flange 31 and the support member 25 are secured together with bolts 5.

Then, as shown in FIG. 4, the chamber cover 16 is fastened to the electron gun chamber 10 with bolts 18, and the top opening of the electron gun chamber 10 is closed off by the chamber cover 16. The interior of the electron optical column 101 is evacuated to a vacuum. Then, the whole electron optical column 101 of the electron microscope 1 is baked. Because of the steps described thus far, the emitter 35 can be replaced.

1.5. Advantageous Effects

In the electron gun 100, the insulator unit 20 is secured in the through-hole 11*a* formed in the side wall 11 of the electron gun chamber 10. The emitter unit 30 can be detachably attached to the insulator unit 20. Also, in the electron gun chamber 10, the emitter 35 is placed on the optical axis OA to bring the insulator unit terminal 28*a* and the emitter unit terminal 32*a* into contact with each other. The insulator unit terminal 28*b* and the emitter unit terminal 32*b* are brought into contact with each other. In addition, the insulator unit terminal 28*c* and the emitter unit terminal 32*c* are brought into contact with each other.

In this way, in the electron gun 100, the emitter unit 30 can be attached to and detached from the insulator unit 20 and so the emitter 35 can be replaced easily. Also, in the electron gun 100, placing the emitter 35 on the optical axis OA brings the terminals of the emitter unit 30 into contact with their respective terminals of the insulator unit 20. Consequently, the emitter 35 can be replaced easily.

Furthermore, in the electron gun 100, the emitter unit 30 can be removed independently of the insulator unit 20 and, therefore, during replacement of the emitter 35, a less number of members need to be worked on than conventional. This can improve the workability. Furthermore, since the emitter unit 30 can be baked by itself, the baking time can be shortened.

If the emitter 35, extraction electrode 38, and supportive insulator 26 constitute a single, unitary assembly, for example, when the emitter 35 is taken out of the electron optical column 101, the large assembly must be worked on and hence the workability is low. Also, it is difficult to bake this unitary assembly by itself, thus prolonging the baking time.

In the electron gun 100, the insulator unit 20 is mounted to the side wall 11 of the electron gun chamber 10 and so the high-voltage cable 180 can be introduced from a side of the electron optical column 101. Therefore, the height of the electron gun 100 can be suppressed as compared, for example, with the case where the high-voltage cable 180 is introduced from above the gun.

In the electron gun 100, the insulator unit 20 has the support member 25 that mechanically supports the emitter unit 30. Supporting the emitter unit 30 with the support member 25 places the emitter 35 on the optical axis OA. Also, the terminals of the emitter unit 30 are brought into contact with their respective terminals of the insulator unit 20. In this way, in the electron gun 100, since the emitter unit 30 is mechanically supported by the support member 25, the emitter 35 is placed in position. This makes it unnecessary to mechanically adjust the position of the emitter 35 with a screw or the like. Accordingly, the emitter 35 can be replaced in a short time. Furthermore, the non-necessity of mechanical adjustment of the position of the emitter 35 makes it unnecessary to use a mechanical part having a large surface area such as bellows. In consequence, the interior of the electron gun chamber 10 can be maintained at a high vacuum.

In the electron gun 100, the support member 25 is cylindrical. Inserting the emitter unit 30 into the support member 25 places the emitter 35 on the optical axis OA. Therefore, in the electron gun 100, the emitter 35 can be replaced in a short time and the interior of the electron gun chamber 10 can be maintained at a high vacuum.

In the electron gun 100, each terminal of the emitter unit 30 is a resilient body which consists of a leaf spring, for example. Therefore, in the electron gun 100, it is assured that the terminals of the emitter unit 30 are brought into contact with their respective terminals of the insulator unit 20.

In the first embodiment described above, each terminal of the emitter unit 30 is a resilient leaf spring. Alternatively, each terminal of the insulator unit 20 may be a resilient leaf spring.

2. Second Embodiment

2.1. Electron Microscope

An electron microscope associated with a second embodiment is next described. In this electron microscope, 1, the type of the mounted electron gun can be varied. In the following description, only differences with the electron microscope 1 of the first embodiment are set forth; a description of similarities is omitted.

2.2. Electron Gun

Figure 7:
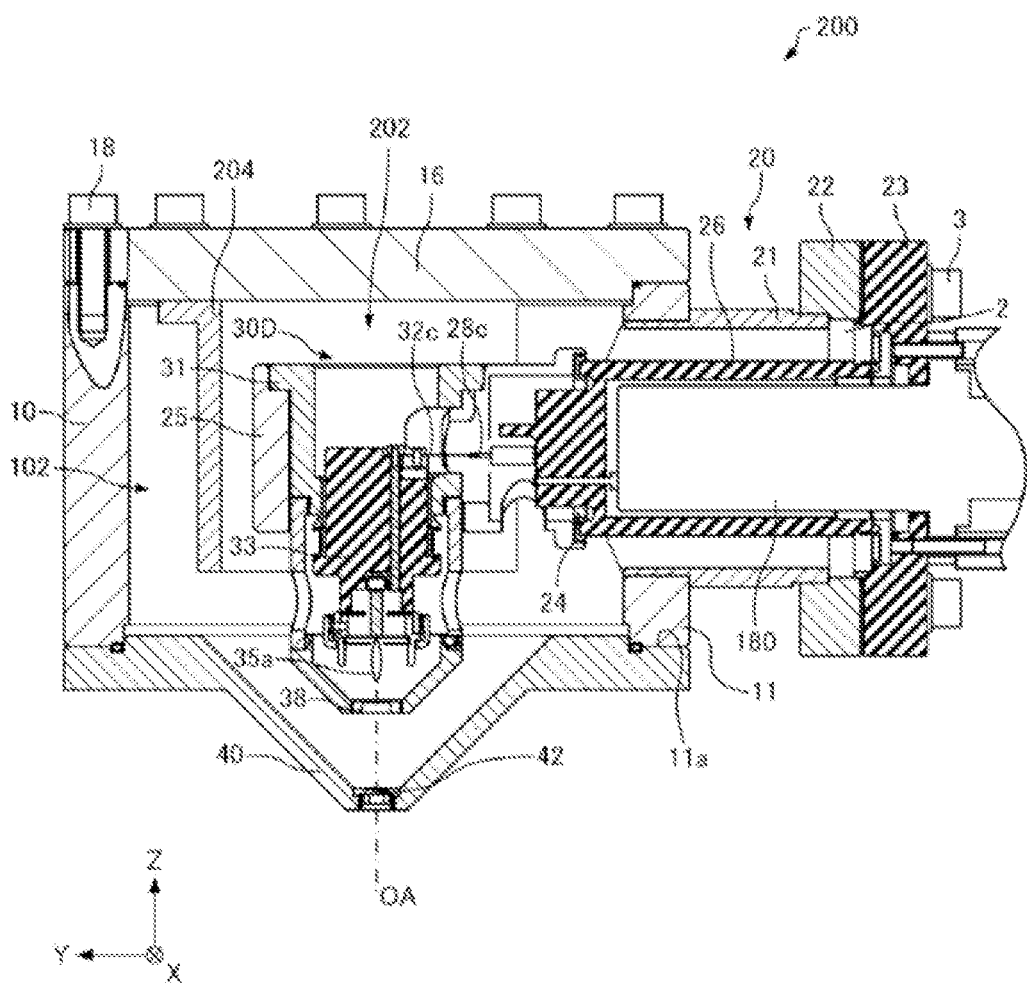
FIG. 7 is a schematic cross-sectional view of an EM electron gun associated with a second embodiment.

FIG. 7 is a typical cross-sectional view of an electron gun assembly 200 of the electron microscope 1 associated with the second embodiment. Those members of the electron gun assembly 200 which are similar in function to their respective counterparts of the above-described electron gun 100 are indicated by the same reference numerals as in the foregoing figures and a detailed description thereof is omitted.

The electron gun assembly 200 includes a Schottky emitter unit 30 constituting a Schottky emission gun shown in FIGS. 2-4 and a CFEG emitter unit 30D constituting a cold field emission gun (CFEG) shown in FIG. 7. In the electron gun assembly 200, either the Schottky emitter unit 30 or the CFEG emitter unit 30D can be mounted to the insulator unit 20.

A cold field emission gun (CFEG) applies a strong electric field to the emitter 35*a* at room temperature and emits electrons by the tunnel effect. In the CFEG emitter unit 30D, the emitter 35*a* is a tungsten chip, for example.

The Schottky emitter unit 30 shown in FIG. 2 has three terminals 32*a*, 32*b*, and 32*c*. On the other hand, the CFEG emitter unit 30D has no suppressor and so has two terminals electrically connected to the emitter 35*a*. For example, the CFEG emitter unit 30D may have the third terminal 32*c* which is a dummy terminal. No restriction is imposed on the number of terminals of the CFEG emitter unit 30D.

As shown in FIG. 7, the electron gun assembly 200 includes a vacuum pump 202 that is a non-evaporable getter pump, for example, which utilizes the gettering action, i.e., the pump performs pumping by adsorbing gaseous molecules onto the surface of a solid material.

The vacuum pump 202 can be mounted to the chamber cover 16 and includes a base plate 204 coated with a non-evaporable getter which adsorbs and removes gaseous molecules. Examples of such a non-evaporable material include titanium, zirconium, and alloys thereof. The vacuum pump 202 can be detachably mounted to the chamber cover 16.

2.3. Operation of Electron Gun Assembly

In the electron gun assembly 200, if the emitter unit 30D has been mounted to the insulator unit 20, a high voltage is applied from the high-voltage power supply 170 to the emitter 35a via the high-voltage cable 180. Also, an extraction voltage is applied from the high-voltage power supply 170 to the extraction electrode 38 also via the high-voltage cable 180.

In the electron gun assembly 200, if the extraction voltage is applied to the extraction electrode 38, electrons are released from the electron emitter 35a by the tunnel effect and then accelerated by the anode 40 at ground potential. The electrons are then focused by the condenser lenses 110.

The operation of the electron gun assembly 200 when the emitter unit 30 has been mounted is similar to the operation in the first embodiment and a description thereof is omitted.

2.4. Replacement of Emitter Unit

In the following, there will be presented a case where the Schottky emitter unit 30 is replaced by the CFEG emitter unit 30D. First, the interior of the electron gun chamber 10 is put at atmospheric pressure. Then, the bolts 18 shown in FIG. 4 are removed, and the chamber cover 16 is taken out from the electron gun chamber 10. Subsequently, the bolts 5 (FIG. 2) fastening together the Schottky emitter unit 30 and the support member 25 are removed.

Then, as shown in FIG. 6, the emitter unit 30 is raised and taken out through the top opening of the electron gun chamber 10. The CFEG emitter unit 30D is then baked and inserted into the support member 25 of the insulator unit 20 along the Z-axis from the top opening of the electron gun chamber 10. Consequently, the CFEG emitter unit 30D is fitted to the support member 25 and the emitter 35a is placed in position.

Inserting the CFEG emitter unit 30D into the support member 25 brings the terminals of the CFEG emitter unit 30D into contact with their respective terminals of the insulator unit 20, so that these emitter unit terminals undergo flexure. As a result, the CFEG emitter unit 30D and the high-voltage power supply 170 are electrically interconnected. After inserting the CFEG emitter unit 30D into the support member 25, the flange 31 and the support member 25 are secured together with the bolts 5.

The base plate 204 is then mounted to the chamber cover 16. The chamber cover 16, along with the base plate 204, is secured to the electron gun chamber 10 with the bolts 18. The top opening of the electron gun chamber 10 is closed off by the chamber cover 16. The interior of the electron optical column 101 is evacuated to a vacuum.

The whole electron optical column 101 of the electron microscope 1 is then baked. As a result, the non-evaporable getter can be activated. Because of the processing steps described so far, the Schottky emitter unit 30 can be replaced by the CFEG emitter unit 30D.

2.5. Advantageous Effects

The electron gun assembly 200 includes the vacuum pump 202 mounted to the chamber cover 16 that seals off the electron gun chamber 10. In the electron gun assembly 200, the insulator unit 20 is secured in the through-hole 11a formed in the sidewall 11 of the electron gun chamber 10 and so the vacuum pump 202 can be mounted to the chamber cover 16. The interior of the electron gun chamber 10 can be maintained at a high vacuum by the vacuum pump 202.

The electron gun assembly 200 includes the Schottky emitter unit 30 and the CFEG emitter unit 30D capable of being replaced by the Schottky emitter unit 30. The two emitter units 30 and 30D are different in mechanism of electron emission. Therefore, with the electron gun assembly 200, the sample S can be observed or analyzed using the plural electron guns which are different in mechanism of electron emission.

For example, the electron gun assembly 200 can be operated as a Schottky electron gun by mounting the Schottky emitter unit 30 to the insulator unit 20, and the electron gun assembly 200 can be operated as a cold field emission gun (CFEG) by mounting the CFEG emitter unit 30D to the insulator unit 20.

2.6. Modified Embodiments

In the above embodiment, the Schottky emitter unit 30 constituting a Schottky electron gun and the CFEG emitter unit 30D constituting a CFEG electron gun can be replaced with each other. Types of replaceable electron gun emitter unit are not restricted to these two. For example, the electron gun assembly 200 may further include an emitter unit constituting a thermionic emission electron gun. That is, the electron gun assembly 200 may be operated as a thermionic emission electron gun. In this way, the electron gun assembly 200 can include plural types of emitter unit capable of operating as electron guns which are different in mechanism of electron emission.

The emitters of the two emitter units 30 and 30D may be made of different materials. For example, the emitter unit 30 may constitute a thermionic emission electron gun and its emitter 35 may be made of lanthanum hexaboride. The emitter unit 30D may constitute a thermionic emission electron gun and its emitter 35a may be made of tungsten.

The number of terminals of an emitter unit may be varied according to the type of the emitter unit. At this time, the number of terminals of the insulator unit 20 may be varied according to the number of terminals of the emitter unit. For example, the insulator unit 20 may have plural terminals each of which can be switched to operative or inoperative state according to the number of terminals of the used emitter unit.

3. Third Embodiment

3.1. Electron Microscope

An electron microscope, 1, associated with a third embodiment is next described. This electron microscope 1 is different in electron gun configuration from the electron microscope 1 shown in the above-cited FIG. 1. In the following description, only differences with the above-stated electron microscope 1 associated with the first embodiment are described. A description of similarities is omitted.

3.2. Electron Gun

Figure 8:
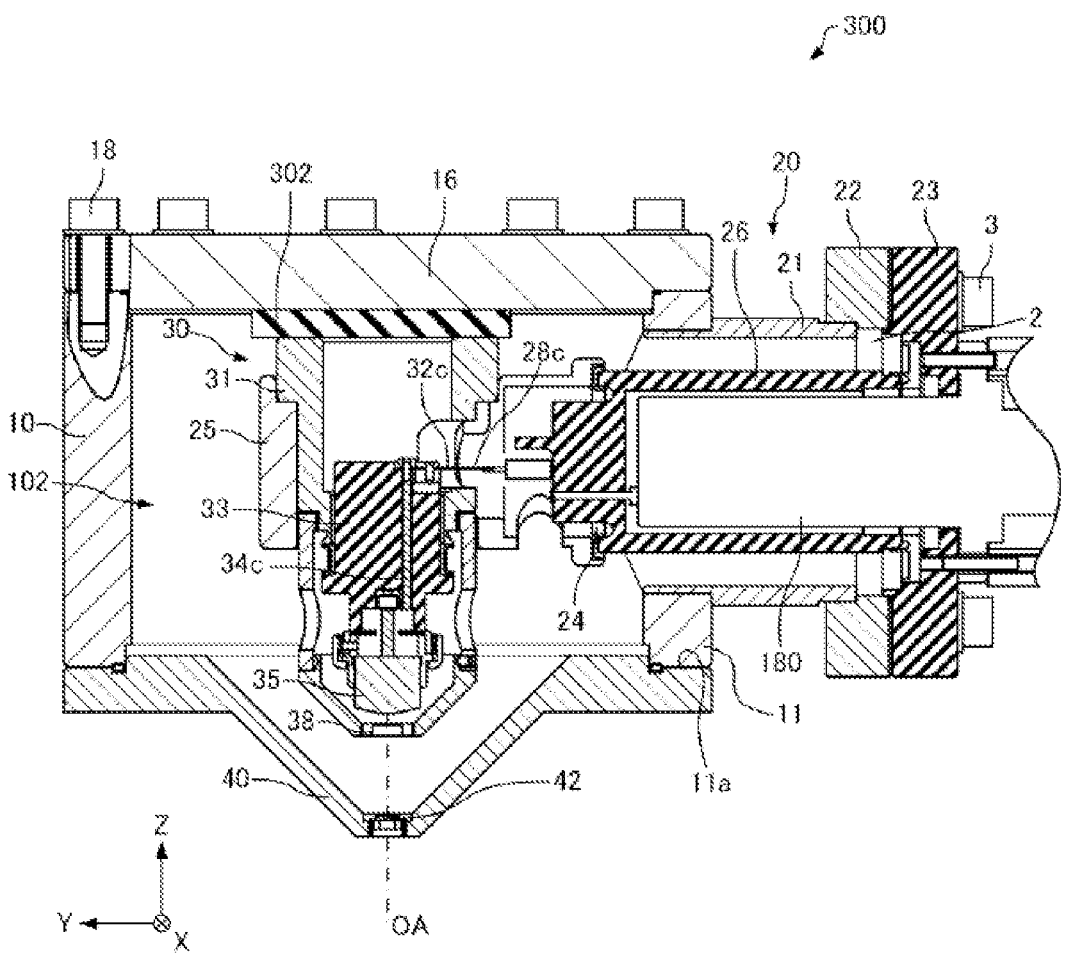
FIG. 8 is a schematic cross-sectional view of an EM electron gun associated with a third embodiment.

The electron microscope 1 associated with the third embodiment has an electron gun 300 as shown in a typical cross-sectional view of FIG. 8. Those members of the electron gun 300 which are similar in function to their respective counterparts of the above stated electron gun 100 are indicated by the same reference numerals as in the foregoing figures and a detailed description thereof is omitted.

As shown in FIG. 4, in the electron gun 100, the insulator unit 20 has the support member 25 providing mechanical support of the emitter unit 30, whereby the emitter 35 is placed on the optical axis OA. The terminals of the emitter unit 30 are brought into contact with their respective terminals of the insulator unit 20.

On the other hand, in the electron gun 300, as shown in FIG. 8, the emitter unit 30 is mounted to the chamber cover 16, which in turn is mounted in the electron gun chamber 10. As a result, the emitter 35 is placed on the optical axis OA. The terminals of the emitter unit 30 are brought into contact with their respective terminals of the insulator unit 20.

The emitter unit 30 is mounted to the chamber cover 16 as described above. As shown in FIG. 8, the insulative member 302 is interposed between the chamber cover 16 and the emitter unit 30 and can provide electrical insulation between the flange 31 of the emitter unit 30 and the chamber cover 16.

The emitter unit 30 is mechanically supported by the chamber cover 16. In the electron gun 300, the support member 25 of the insulator unit 20 does not mechanically support the emitter unit 30. In the electron gun 300, the support member 25 comes into contact with the flange 31 of the emitter unit 30 to thereby electrically interconnect the high-voltage power supply 170 and the extraction electrode 38. Although not illustrated, the emitter unit 30 and the support member 25 may not be in direct contact with each other, and a pin mounted to the support member 25 may come into contact with the flange 31 to thereby electrically interconnect the high-voltage power supply 170 and the extraction electrode 38. The emitter 35 is placed in position by mounting the chamber cover 16 in the electron gun chamber 10.

3.3. Replacement of Emitter

First, the interior of the electron gun chamber 10 is placed at atmospheric pressure. Then, the bolts 18 are removed, and the chamber cover 16 having the emitter unit 30 secured thereto is taken out of the electron gun chamber 10.

Then, the insulative member 302 is taken out from the chamber cover 16. The insulative member 302 is then removed from the emitter unit 30. Then, the emitter 35 is taken out from the emitter unit 30 and a new emitter 35 is mounted.

In the emitter unit 30 having the new emitter 35 mounted thereon, the emitter 35 and the extraction electrode 38 are adjusted in position. Then, the emitter unit 30 is put into a furnace and baked.

After the baking, the emitter unit 30 is mounted on the insulative member 302, and the insulative member 302 having the emitter unit 30 mounted thereon is mounted to the chamber cover 16. The chamber cover 16 is secured to the electron gun chamber 10 with the bolts 18.

At this time, the chamber cover 16 and the electron gun chamber 10 are fitted together. This places the emitter unit 30 in position. As a result, the emitter 35 is placed on the optical axis OA. The terminals of the emitter unit 30 come into contact with their respective terminals of the insulator unit 20. The emitter 35 can be placed in position by mounting the chamber cover 16 having the emitter unit 30 mounted thereon to the electron gun chamber 10 in this way.

Then, the interior of the electron optical column 101 is evacuated to a vacuum, and the whole electron optical column 101 is baked. Because of the processing steps described so far, the emitter 35 can be replaced.

3.4. Advantageous Effects

In the electron gun 300, the emitter unit 30 is mounted to the chamber cover 16 which in turn is mounted to the electron gun chamber 10, whereby the emitter 35 is placed on the optical axis OA and the terminals of the emitter unit 30 are brought into contact with the respective terminals of the insulator unit 20. Consequently, in the electron gun 300, the emitter 35 can be replaced easily.

4. Fourth Embodiment

Figure 9:
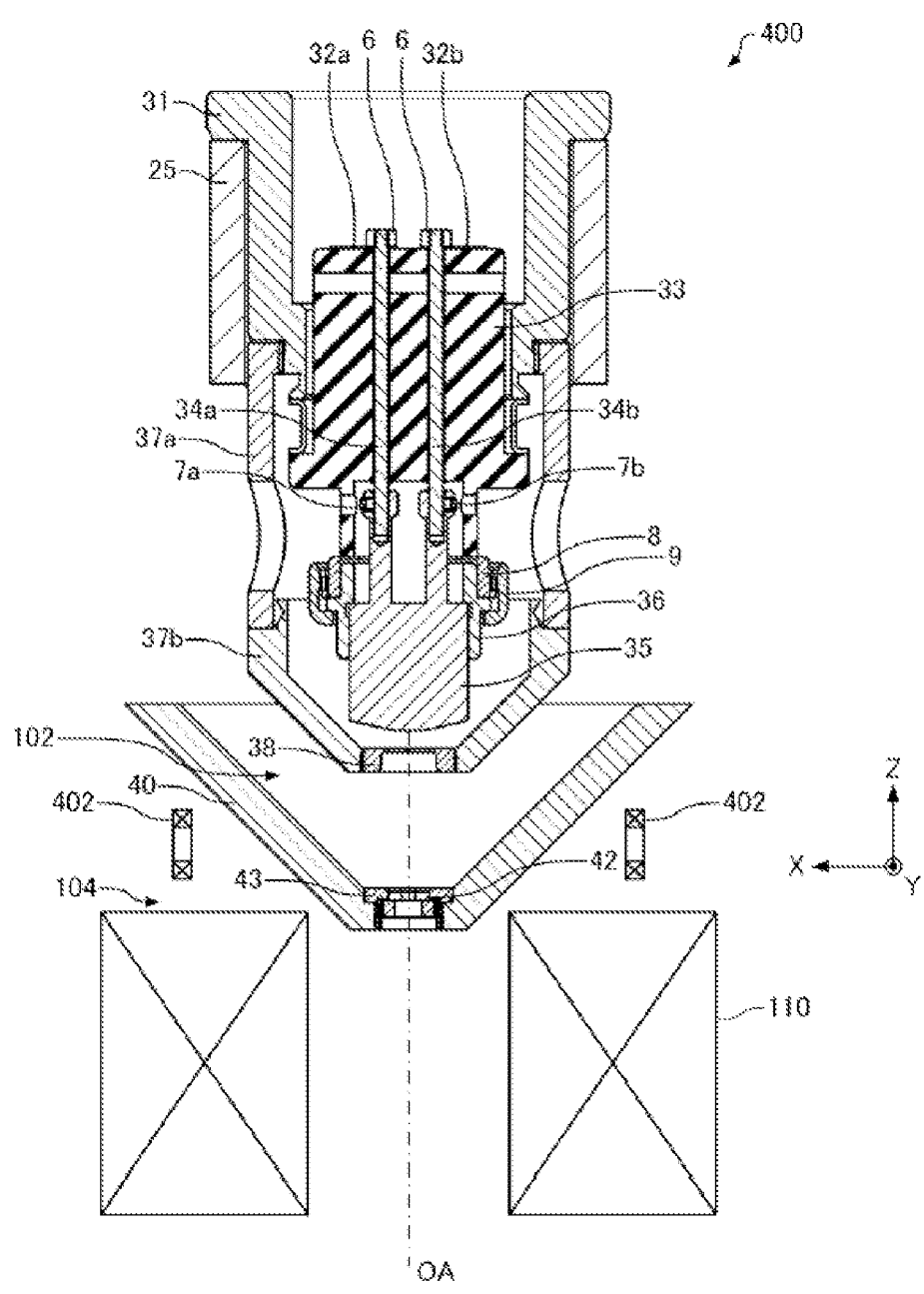
FIG. 9 is a schematic cross-sectional view of an EM electron gun associated with a fourth embodiment.

An electron microscope, 1, associated with a fourth embodiment is next described. FIG. 9 is a schematic cross-sectional view of an electron gun 400 for use in this electron microscope 1. In the following description, those members of the electron gun 400 which are functionally similar to their counterparts of the foregoing electron gun 100 are denoted by the same reference numerals as in the foregoing figures and a detailed description thereof is omitted.

As shown in FIG. 9, the electron gun 400 has an alignment coil 402 which deflects the electron beam released from the emitter 35. As a result, the electron beam released from the electron gun 400 can be aligned with the optical axis OA, i.e., the beam can be axially aligned.

For example, when the emitter unit 30 is supported on the support member 25 of the insulator unit 20 and placed in position, if the emitter 35 deviates from the optical axis OA, the electron beam released from the electron gun 400 can be aligned to the optical axis OA using the alignment coil 402.

In this example, the alignment coil 402 is mounted in the electron gun using the emitter unit 30 that is a Schottky emission gun. The alignment coil 402 may also be mounted in an electron gun other than Schottky emission guns.

5. Modified Embodiments

It is to be understood that the present invention is not restricted to the above embodiments but rather can be practiced in various modified forms without departing from the gist of the present invention. For example, in the above-stated first through fourth embodiments, the charged particle beam system associated with the present invention is a scanning electron microscope. The charged particle beam system associated with the present invention is not restricted to scanning electron microscopes. The charged particle beam system associated with the present invention may also be a scanning transmission electron microscope (STEM), a scanning electron microscope (SEM), an electron probe microanalyzer (EMPA), an electron beam lithography system, or the like. Furthermore, in the description of the foregoing first through fourth embodiments, the charged particle beam source associated with the present invention is an electron gun equipped with an electron emitter that emits electrons. The charged particle beam source associated with the present invention may also be a charged particle beam source equipped with a charged particle emitter that releases charged particles other than electrons. For example, the charged particle beam source associated with the present invention may be an ion gun equipped with an emitter that releases ions. Additionally, the charged particle beam system associated with the present invention may be a focused ion beam (FIB) system.

It is also to be understood that the above-stated embodiments and modifications are merely exemplary and that the present invention is not restricted to them. For example, the embodiments and modifications may be appropriately combined.

The present invention is not restricted to the foregoing embodiments but rather various modifications may be possible. For example, the present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

The invention claimed is:

1. A charged particle beam source configured to release a charged particle beam aligned with an optical axis, comprising:

a chamber having a side wall;

a first unit comprising a supportive insulative member mechanically supporting a cable, a first set of terminals electrically connected to the cable, and a support member comprising a central axis coincident with the optical axis; and a second unit comprising an emitter for emitting charged particles, a second set of terminals electrically connected to the emitter, an electrode positioned under the emitter and provided with a hole for passage of electrons released from the emitter, and a third terminal electrically connected to the electrode, the second unit configured to be detachably mounted to the first unit;

wherein the first unit is secured in a through-hole formed in the side wall of the chamber;

wherein the first unit includes a fourth terminal;

wherein the first set of terminals is elongated in a direction orthogonal to the optical axis;

wherein the second set of terminals is elongated in a direction orthogonal to the optical axis when the second unit is inserted into the support member; and wherein the second unit is configured to be inserted into the support member such that the emitter is placed on the optical axis within the chamber, whereby the first and second sets of terminals are brought into contact with each other and the third and fourth terminals are brought into contact with each other.

2. The charged particle beam source as set forth in claim 1, wherein the support member provides mechanical support of said second unit.

3. The charged particle beam source as set forth in claim 1, further comprising a cover that closes off said chamber.

4. The charged particle beam source as set forth in claim 3, wherein said second unit is mounted to said cover which in turn is mounted to said chamber, whereby said emitter is placed on said optical axis and said first and second sets of terminals are brought into contact with each other.

5. The charged particle beam source as set forth in claim 3, further comprising a vacuum pump mounted to said cover.

6. The charged particle beam source as set forth in claim 5, wherein said vacuum pump is a getter pump.

7. The charged particle beam source as set forth in claim 1, wherein each of said second set of terminals is a resilient body.

8. The charged particle beam source as set forth in claim 7, wherein each of said second set of terminals is a leaf spring.

9. The charged particle beam source as set forth in claim 1, further comprising a third unit which is replaceable with said second unit.

10. The charged particle beam source as set forth in claim 9, wherein said second unit and said third unit utilize different mechanisms of electron emission.

11. The charged particle beam source as set forth in claim 10, wherein said second unit constitutes a Schottky emission gun, a cold field emission gun, or a thermionic emission gun, and wherein said third unit constitutes a Schottky emission gun, a cold field emission gun, or a thermionic emission gun.

12. The charged particle beam source as set forth in claim 10, wherein the emitter of said second unit and the emitter of said third unit are of different types.

13. The charged particle beam source as set forth in claim 12, wherein the emitter of said second unit is made of lanthanum hexaboride, and wherein the emitter of said third unit is made of tungsten.

14. A charged particle beam system including a charged particle beam source as set forth in claim 1.

* * * * *